United States Patent
Shea et al.

(10) Patent No.: US 8,138,558 B2
(45) Date of Patent: Mar. 20, 2012

(54) SEMICONDUCTOR DEVICE AND METHOD OF FORMING LOW VOLTAGE MOSFET FOR PORTABLE ELECTRONIC DEVICES AND DATA PROCESSING CENTERS

(75) Inventors: Patrick M. Shea, Oviedo, FL (US); Samuel J. Anderson, Tempe, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 28 days.

(21) Appl. No.: 12/859,943

(22) Filed: Aug. 20, 2010

(65) Prior Publication Data

US 2012/0044720 A1 Feb. 23, 2012

(51) Int. Cl.
*H01L 27/088* (2006.01)
(52) U.S. Cl. .......................................... 257/401
(58) Field of Classification Search .................. None
See application file for complete search history.

(56) References Cited

U.S. PATENT DOCUMENTS

| | | | | |
|---|---|---|---|---|
| 6,300,661 B1* | 10/2001 | Kadosh et al. | ................ | 257/371 |
| 2002/0050614 A1* | 5/2002 | Unnikrishnan | ................ | 257/347 |
| 2004/0262669 A1* | 12/2004 | Shum et al. | ................ | 257/315 |
| 2005/0180215 A1* | 8/2005 | Shum et al. | ................ | 365/185.22 |
| 2007/0102757 A1* | 5/2007 | Miyake et al. | ................ | 257/327 |
| 2007/0141792 A1* | 6/2007 | Cai | ................ | 438/286 |
| 2007/0241402 A1* | 10/2007 | Hirano | ................ | 257/347 |
| 2009/0194811 A1* | 8/2009 | Pan et al. | ................ | 257/330 |
| 2010/0084704 A1* | 4/2010 | Darwish et al. | ................ | 257/330 |
| 2010/0203703 A1* | 8/2010 | Tilke et al. | ................ | 438/424 |
| 2010/0237411 A1* | 9/2010 | Hsieh | ................ | 257/336 |
| 2011/0156679 A1* | 6/2011 | Girdhar et al. | ................ | 323/282 |

* cited by examiner

*Primary Examiner* — N Drew Richards
*Assistant Examiner* — Peter Bradford
(74) *Attorney, Agent, or Firm* — Robert D. Atkins; Patent Law Group: Atkins & Associates, P.C.

(57) ABSTRACT

A semiconductor device has a well region formed within a substrate. A gate structure is formed over a surface of the substrate. A source region is formed within the substrate adjacent to the gate structure. A drain region is formed within the substrate adjacent to the gate structure. A first clamping region and second clamping region below the source region and drain region. A trench is formed through the source region. The trench allows the width of the source region to be reduced to 0.94 to 1.19 micrometers. A plug is formed through the trench. A source tie is formed through the trench over the plug. An interconnect structure is formed over the source region, drain region, and gate structure. The semiconductor device can be used in a power supply to provide a low voltage to electronic equipment such as a portable electronic device and data processing center.

22 Claims, 15 Drawing Sheets

SEMICONDUCTOR DEVICE AND METHOD OF FORMING LOW VOLTAGE MOSFET FOR PORTABLE ELECTRONIC DEVICES AND DATA PROCESSING CENTERS

FIELD OF THE INVENTION

The present invention relates generally to electronic circuits and semiconductor devices and, more specifically, to a semiconductor device and method of forming a low voltage MOSFET for use with portable electronic devices and data processing centers.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, operate with a lower voltage, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Most modern electronic equipment requires a power supply to provide a direct current (DC) operating potential to the electronic components contained therein. Common types of electronic equipment which use power supplies include personal computers, energy systems, telecommunication systems, audio-video equipment, consumer electronics, automotive components, and other devices which utilize integrated circuits, semiconductor chips, or otherwise require DC operating potential. Most, if not all, semiconductor components require a DC operating potential. However, many sources of electric power are alternating current (AC), or high voltage DC, which must be converted to a lower voltage DC for the electronic equipment.

In one common arrangement, the AC/DC power supply receives an AC input voltage, e.g., between 110 and 240 VAC, and converts the AC input voltage to the requisite DC operating voltage. The AC voltage is routed through a full-wave rectifier bridge and filtered to produce a high voltage DC signal. The high voltage DC signal is processed through a pulse width modulated (PWM) controller and transformer assembly to generate the low voltage, regulated DC output voltage, which is used as the operating potential for the semiconductor components and other devices requiring low voltage DC supply in the electronic equipment. The low voltage DC signal is typically in the range of 5 to 12 VDC. In other cases, a DC/DC power supply receives a high voltage DC signal and provides the low voltage DC signal necessary for the electronic equipment.

MOSFETs are commonly used in electronic circuits, such as communication systems and power supplies. Power MOSFETs are particularly useful when used as electric switches to enable and disable the conduction of relatively large currents. The on/off state of the power MOSFET is controlled by applying and removing a triggering signal at the gate electrode. When turned on, the electric current in the MOSFET flows between the drain and source. When turned off, the electric current is blocked by the MOSFET.

Power MOSFETs are typically arranged in an array of hundreds or thousands of individual MOSFET cells electrically connected in parallel. FIG. 1 shows a conventional single re-channel MOSFET cell 10 formed over p-type substrate 12. MOSFET cell 10 includes an N+ drain region 14, N+ source region 16, polysilicon gate structure 18, and n-channel 20. The insulating sidewall spacers 24 are formed around gate structure 18. Lightly doped drain (LDD) regions 26 are formed under sidewall spacers 24 to extend the horizontal conduction through n-channel 20 to drain region 14 and source region 16. A P+ source tie 28 can be formed by ion implantation.

N+ drain region 14 is coupled to a first operating potential, i.e., $V_{DD}$. In typical operating conditions, $V_{DD}$ is 5-12 volts DC. N+ source region 16 is coupled to a second operating potential, i.e., ground potential. A voltage $V_G$ applied to gate structure 18 induces an electric field over re-channel 20 to cause a current to flow through drain region 14 and source region 16. MOSFET cell 10 has an inherent drain-source resistance ($R_{DSON}$) in the conducting state. MOSFET cell 10 has a length L and width W and cell pitch of 1.36 micrometers (μm). The width W of MOSFET cell 10 controls the electrical resistance of the MOSFET cell. The larger the width W, the smaller the resistance. Typical values for width W are in the tens or hundreds of micrometers (μm). Each MOSFET cell 10 can be scaled to handle microamperes (pa) or perhaps milli-amperes (ma) of drain-source current.

Many applications such as portable electronic devices and data processing centers require a low operating voltage, e.g., less than 5 VDC. The low voltage electronic equipment in the portable electronic devices and data processing centers create a demand for power supplies that can deliver the requisite operating potential.

SUMMARY OF THE INVENTION

A need exists to provide a low voltage MOSFET for use with applications such as portable electronic devices and data processing centers. Accordingly, in one embodiment, the present invention is a method of making a semiconductor device comprising the steps of providing a substrate, forming a well region within the substrate, forming a gate structure over a surface of the substrate, forming a source region within the substrate adjacent to the gate structure, forming a drain region within the substrate adjacent to the gate structure opposite the source region, forming a first clamping region and second clamping region below the source region and drain region, respectively, forming a trench through the source region, forming a plug through the trench into the well region, forming a source tie through the trench over the plug, and forming an interconnect structure over the source region, drain region, and gate structure.

In another embodiment, the present invention is a method of making a semiconductor device comprising the steps of providing a substrate, forming a well region within the substrate, forming a gate structure over a surface of the substrate, forming a source region within the substrate adjacent to the gate structure, forming a drain region within the substrate adjacent to the gate structure opposite the source region, forming a trench through the source region, forming a plug through the trench, forming a source tie through the trench over the plug, and forming an interconnect structure over the source region, drain region, and gate structure.

In another embodiment, the present invention is a semiconductor device comprising a substrate and well region formed within the substrate. A gate structure is formed over a surface of the substrate. A source region is formed within the substrate adjacent to the gate structure. A drain region is formed within the substrate adjacent to the gate structure opposite the source region. A trench is formed through the source region. A plug is formed through the trench. A source tie is formed through the trench over the plug. An interconnect structure is formed over the source region, drain region, and gate structure.

In another embodiment, the present invention is a power supply providing an output voltage to electronic equipment comprising an inductor coupled for receiving an input voltage of the power supply. A control circuit has an input coupled for receiving an output voltage of the power supply. A power transistor has a drain terminal coupled to the inductor, gate terminal coupled to an output of the control circuit, and source terminal coupled to a power supply conductor. The power transistor includes a well region formed within a substrate. A gate structure is formed over a surface of the substrate and coupled to the gate terminal. A source region is formed within the substrate adjacent to the gate structure and coupled to the source terminal. A drain region is formed within the substrate adjacent to the gate structure opposite the source region and coupled to the drain terminal. A trench is formed in the source region. A plug is formed through the trench. A source tie is formed through the trench over the plug.

DETAILED DESCRIPTION OF THE DRAWINGS

Figure 1:
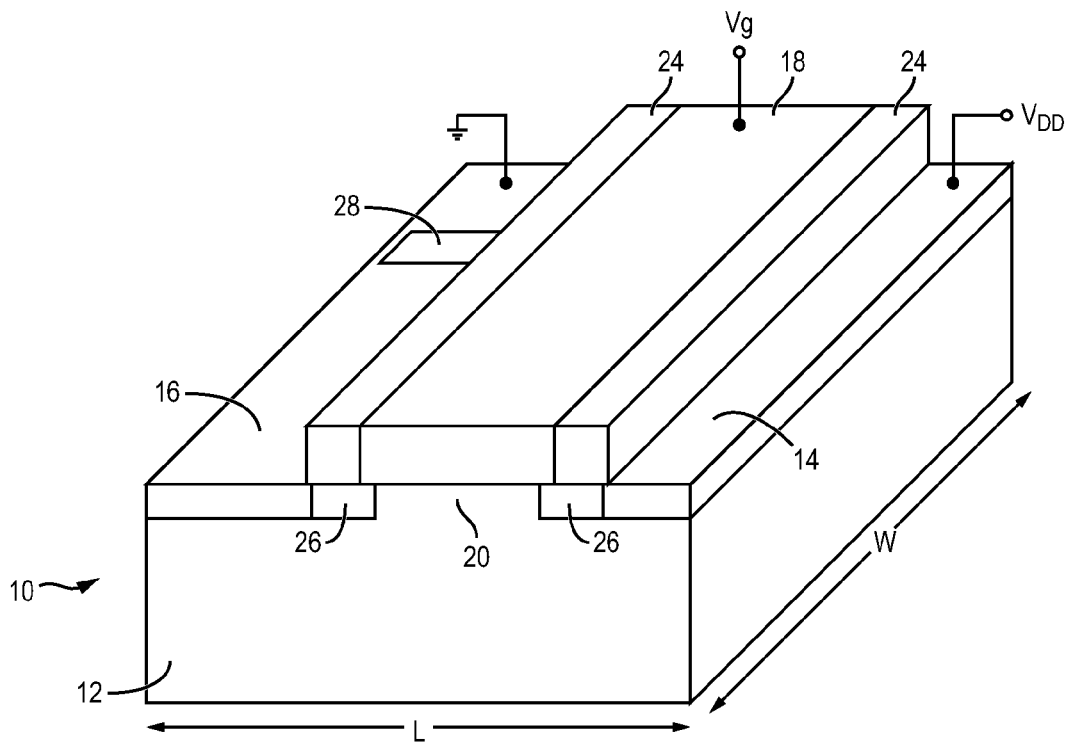
FIG. 1 illustrates a conventional low voltage MOSFET cell.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Most modern electronic equipment requires a power supply to provide a DC operating potential to the electronic components contained therein. Common types of electronic equipment which use power supplies include personal computers, energy systems, telecommunication systems, audio-video equipment, consumer electronics, automotive components, portable electronics, data processing centers, and other devices which utilize integrated circuits, semiconductor chips, or otherwise require DC operating potential. Many semiconductor components require a low voltage DC operating potential. However, many sources of electric power are AC, or high voltage DC, which must be converted to low voltage DC for the electronic equipment.

Figure 2:
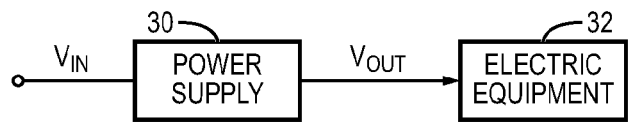
FIG. 2 is block diagram of a power supply providing operating potential to electronic equipment.

In one common arrangement, the AC/DC power supply receives an AC input voltage, e.g., between 110 and 240 VAC, and converts the AC input voltage to the DC operating voltage. Referring to FIG. 2, a PWM power supply 30 is shown providing a DC operating potential to electronic equipment 32. Power supply 30 receives input voltage $V_{IN}$ and produces one or more DC output voltages. The electronic equipment 32 may take the form of personal computers, energy systems, telecommunication systems, audio-video equipment, consumer electronics, automotive components, portable electronics, data processing centers, and other devices which utilize integrated circuits, semiconductor chips, or otherwise require DC operating potential from the power supply.

Figure 3:
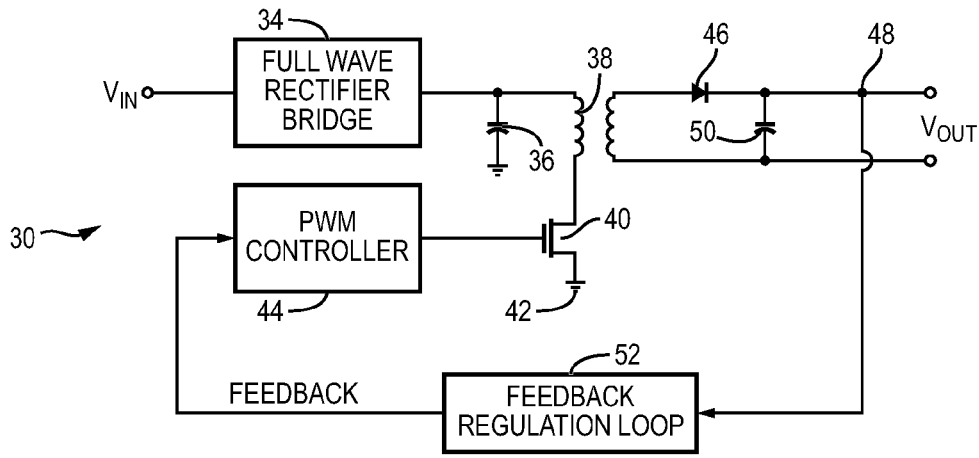
FIG. 3 is a schematic and block diagram of a pulse width modulated power supply.

Further detail of PWM power supply 30 is shown in FIG. 3. The input voltage $V_{IN}$ may be an AC signal, e.g., 110 VAC, or DC signal, e.g., 48 volts. For the case of an AC input voltage, power supply 30 has a full-wave rectifier bridge 34. The full-wave rectifier bridge 34 converts the AC input voltage to a DC voltage. In the case of a DC input voltage, the full-wave rectifier bridge 34 is omitted. Capacitor 36 smoothes and filters the DC voltage. The DC voltage is applied to a primary winding or inductor of transformer 38. The primary winding of transformer 38 is also coupled through power transistor 40 to ground terminal 42. In one embodiment, power transistor 38 is a multi-cell power MOSFET, as described in FIGS. 5a-5q and 6-12. The gate of MOSFET 38 receives a PWM control signal from PWM controller 44. The secondary winding of transformer 38 is coupled to rectifier diode 46 to create the DC output voltage $V_{OUT}$ of power supply 30 at node 48. Capacitor 50 filters the DC output voltage $V_{OUT}$. The DC output voltage $V_{OUT}$ is routed back through feedback regulation loop 52 to a control input of PWM controller 44. The DC output voltage $V_{OUT}$ generates the feedback signal which PWM controller 44 uses to regulate the power conversion process and maintain a relatively constant output voltage $V_{OUT}$ under changing loads. The aforedescribed electrical components of the power supply module are typically mounted to and electrically interconnected through a printed circuit board.

In the power conversion process, PWM controller 44 sets the conduction time duty cycle of MOSFET 40 to store energy in the primary winding of transformer 38 and then transfer the stored energy to the secondary winding during the off-time of MOSFET 40. The output voltage $V_{OUT}$ is determined by the energy transfer between the primary winding and secondary winding of transformer 38. The energy transfer is regulated by PWM controller 44 via the duty cycle of the PWM control signal to MOSFET 40. Feedback regulation loop 52 generates the feedback signal to PWM controller 44 in response to the output voltage $V_{OUT}$ to set the conduction time duty cycle of MOSFET 40.

Consider the case where the load increases from zero to some nominal value. As load increases, the output current demand from power supply 30 increases and the output voltage $V_{OUT}$ decreases. The lower output voltage causes PWM controller 44 to increase the pulse width to power MOSFET 40. The longer conduction time of the power MOSFET 40 stores more energy in the primary winding of transformer 38. Accordingly, more energy is transferred to the secondary winding of transformer 38 during the off-time of power MOSFET 40. The output voltage $V_{OUT}$ of power supply 30 increases to compensate for the increased current demand.

Figure 4:
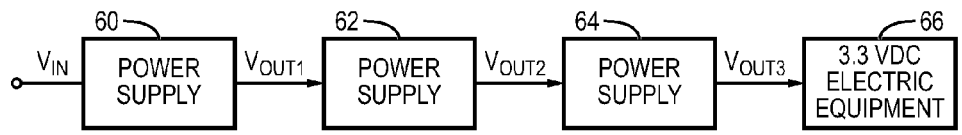
FIG. 4 is a block diagram of a plurality of power supplies staged to provide a low voltage operating potential to electronic equipment.

In some applications of electronic equipment, a plurality of power supplies is serially connected to reduce the DC voltage to requisite levels in discrete steps. In FIG. 4, power supply 60 receives $V_{IN}$ of 110 VAC and provides $V_{OUT1}$ of 12 VDC to power supply 62. Power supply 60 includes full-wave rectifier 34 to convert the AC input voltage to a DC voltage, while power supplies 62 and 64 are DC-DC converters, as described in FIG. 3. Power supply 62 receives the 12 VDC and provides $V_{OUT2}$ of 3.0 VDC to power supply 64. Power supply 64 receives the 3.0 VDC and provides $V_{OUT3}$ of 0.7 VDC to electronic equipment 66. A 3.3 VDC maximum rating of the power MOSFET within power supply 64 allows electronic equipment 66 to operate with lower power supply overhead to exhibit low $R_{DSON}$, fast gate charge recovery time, and fast switching speed.

Figure 5A:
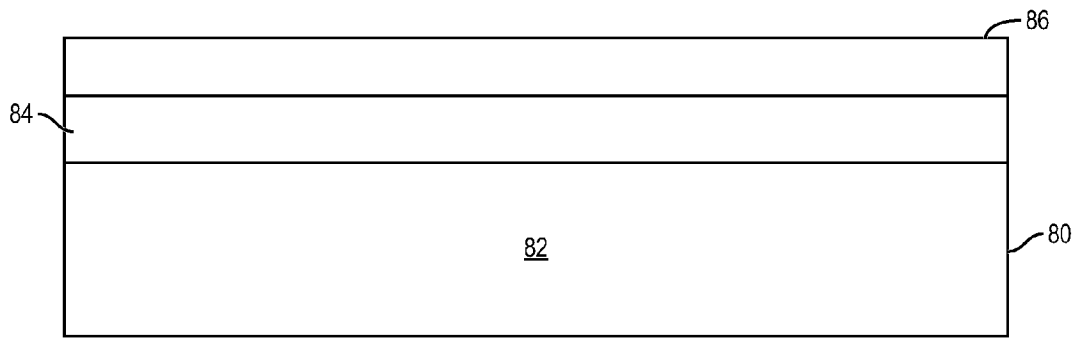
FIGS. 5a-5r illustrate a process of forming a low voltage MOSFET cell with a source trench, P+ plug, P+ source tie, and co-implanted clamp diodes.
Figure 5B:
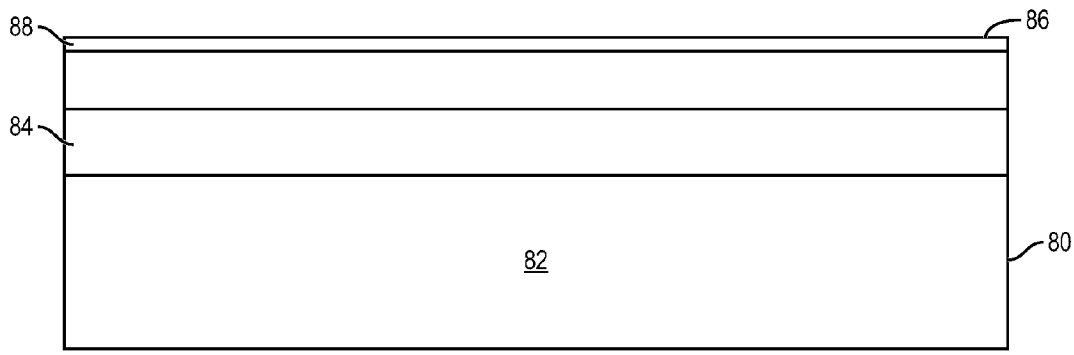
Figure 5C:
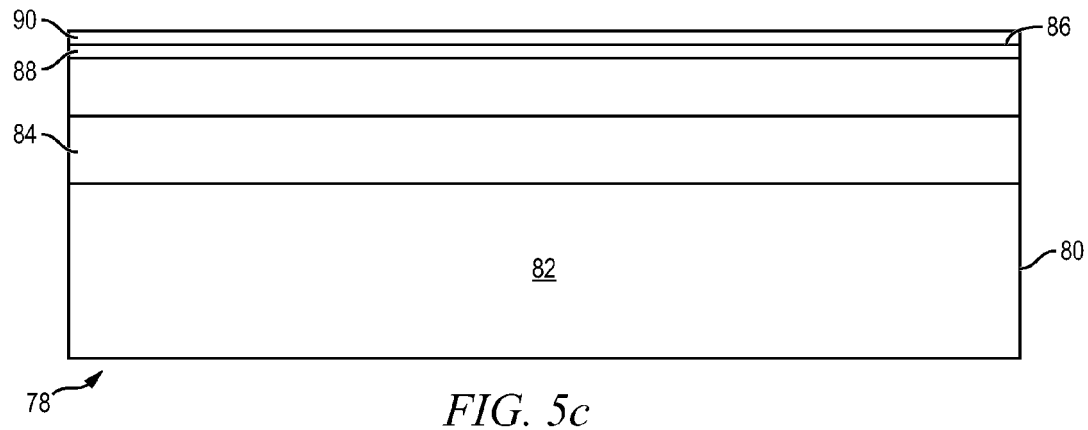
Figure 5D:
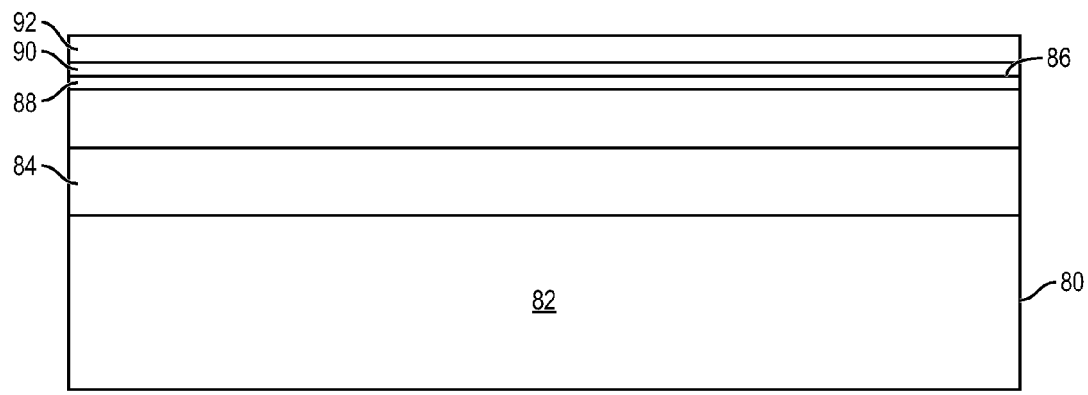
Figure 5E:
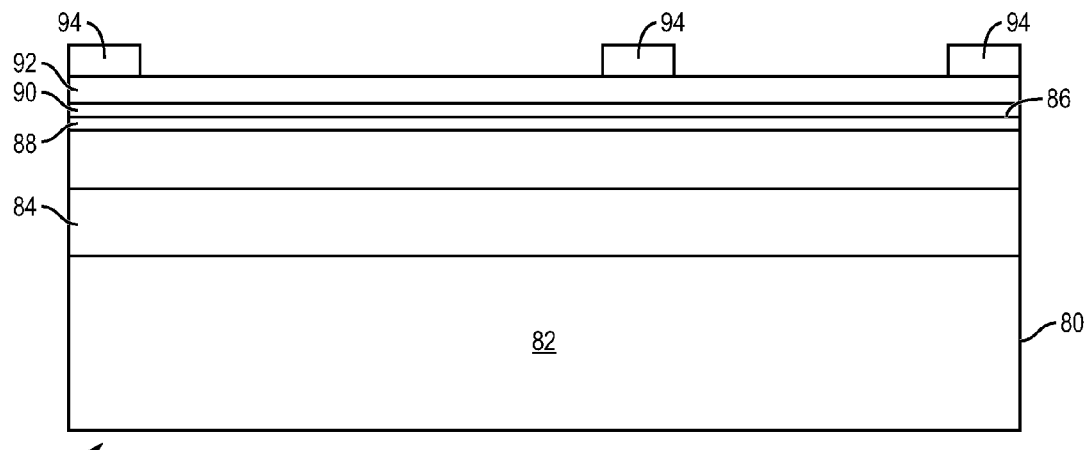
Figure 5F:
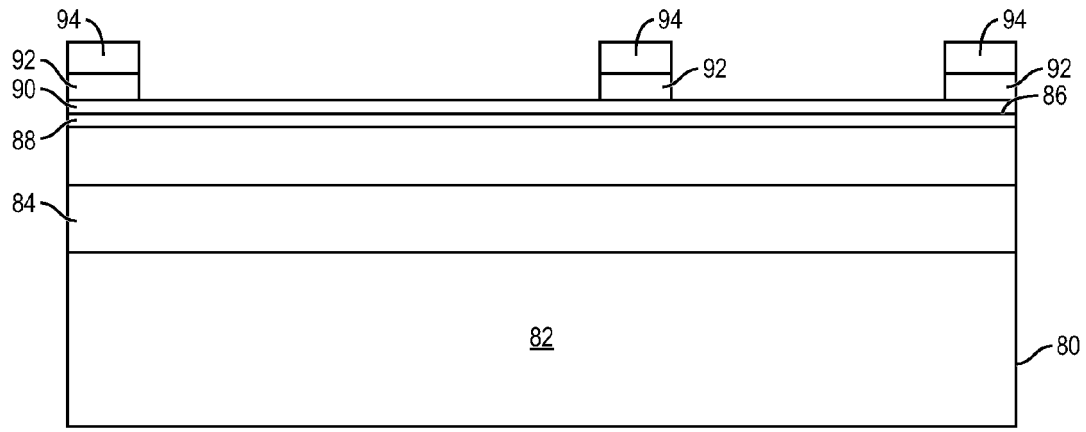
Figure 5G:
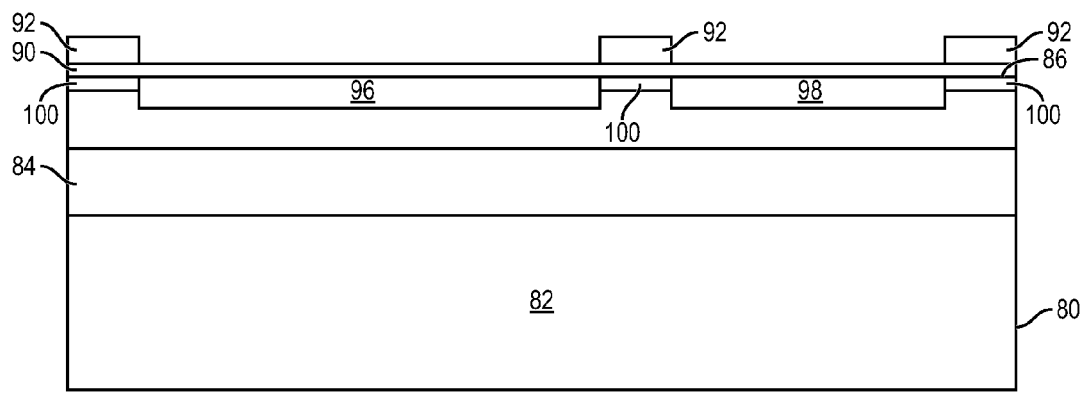
Figure 5H:
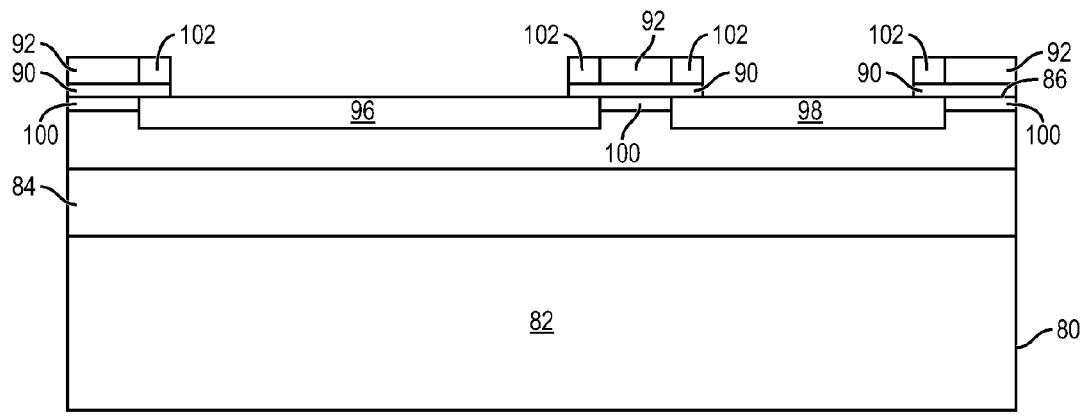
Figure 5I:
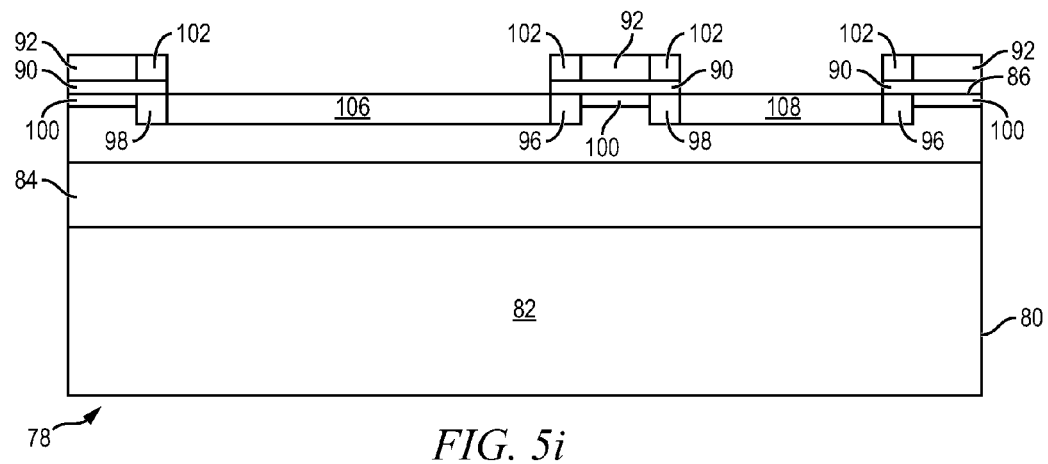
Figure 5J:
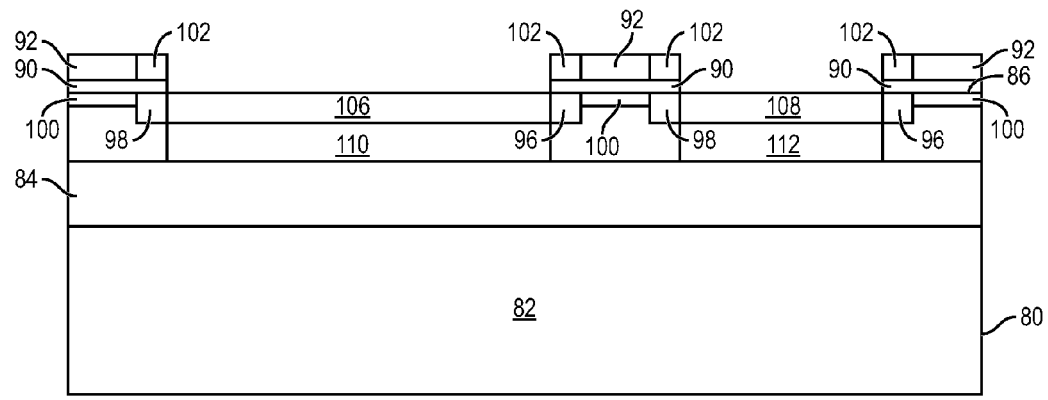
Figure 5K:
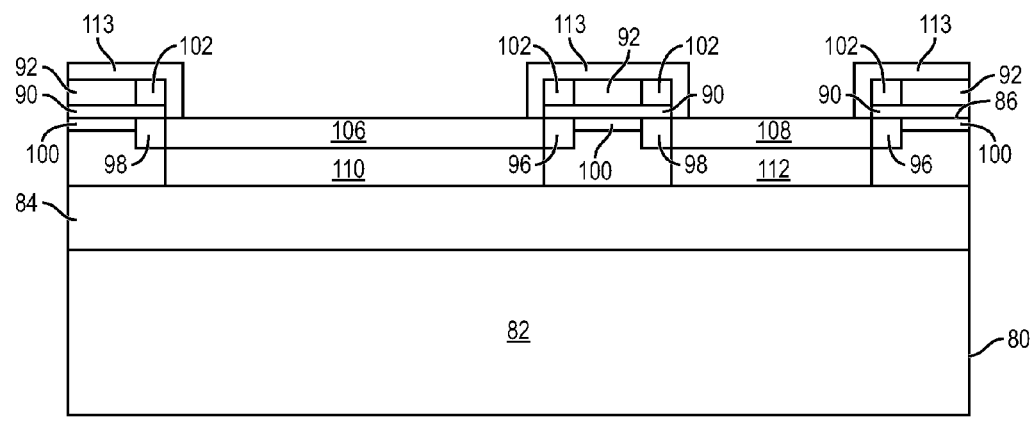
Figure 5L:
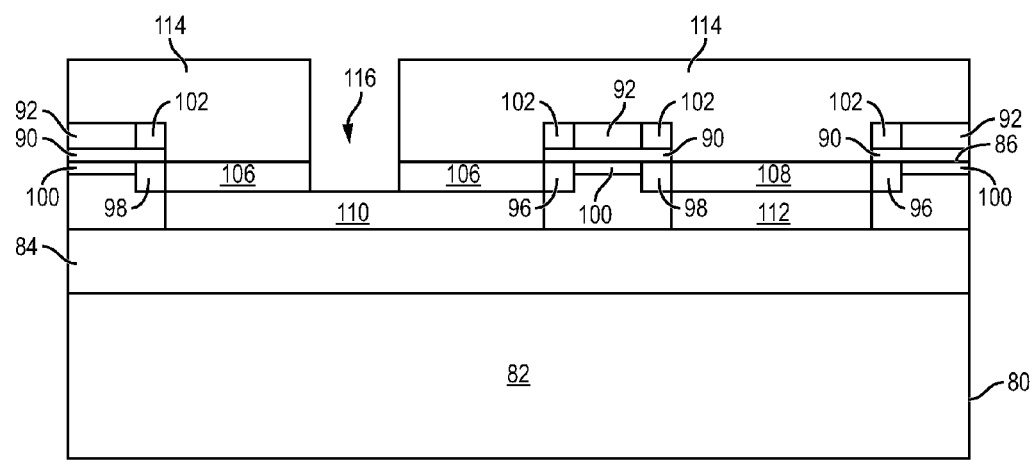
Figure 5M:
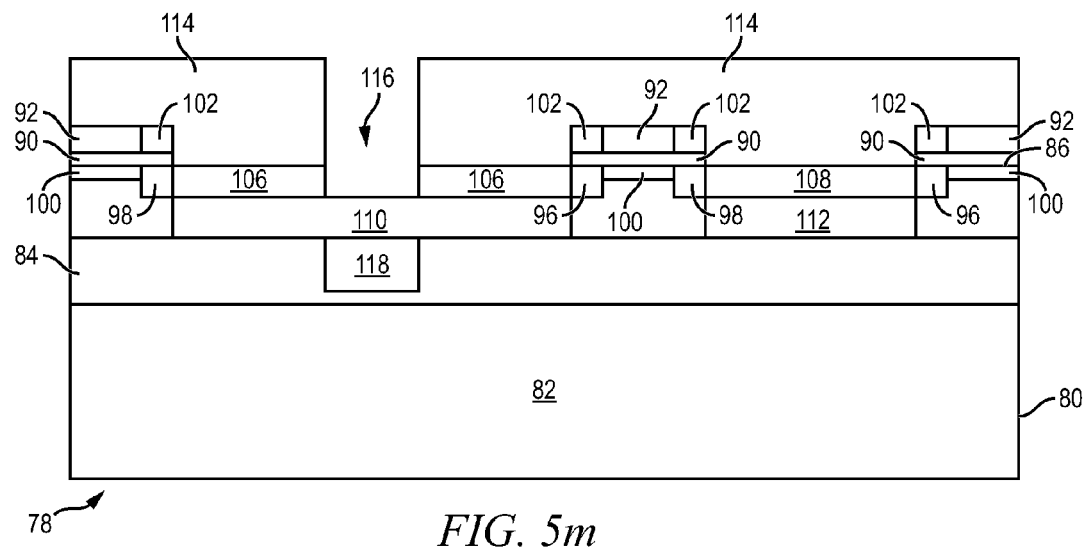
Figure 5N:
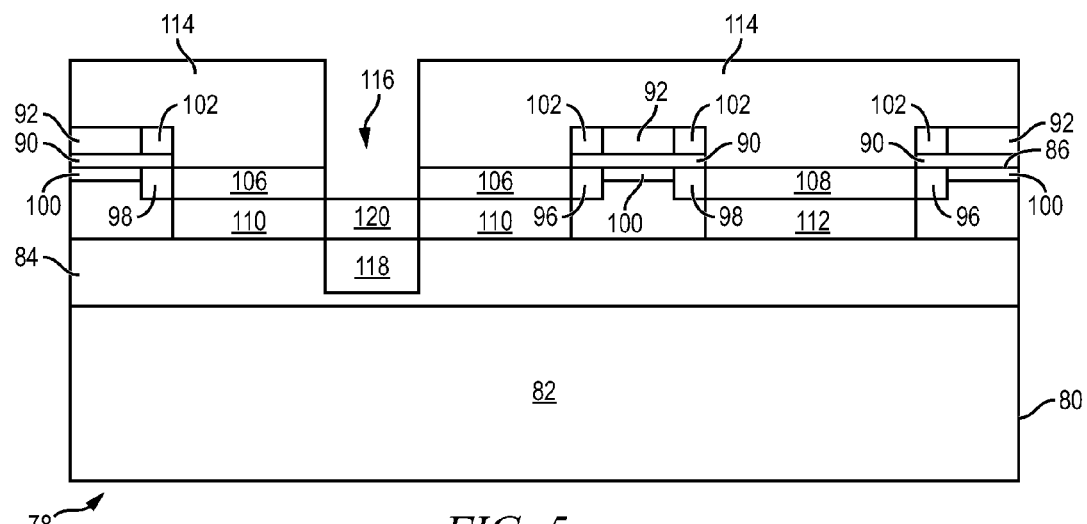
Figure 5O:
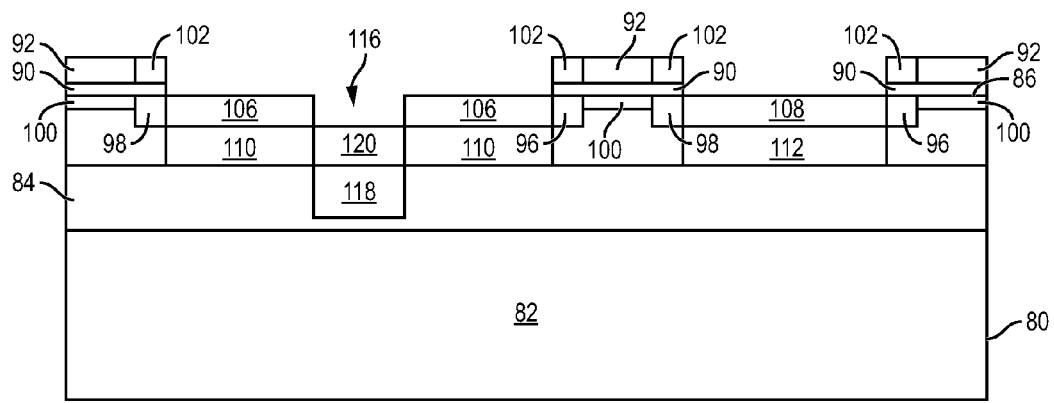
Figure 5P:
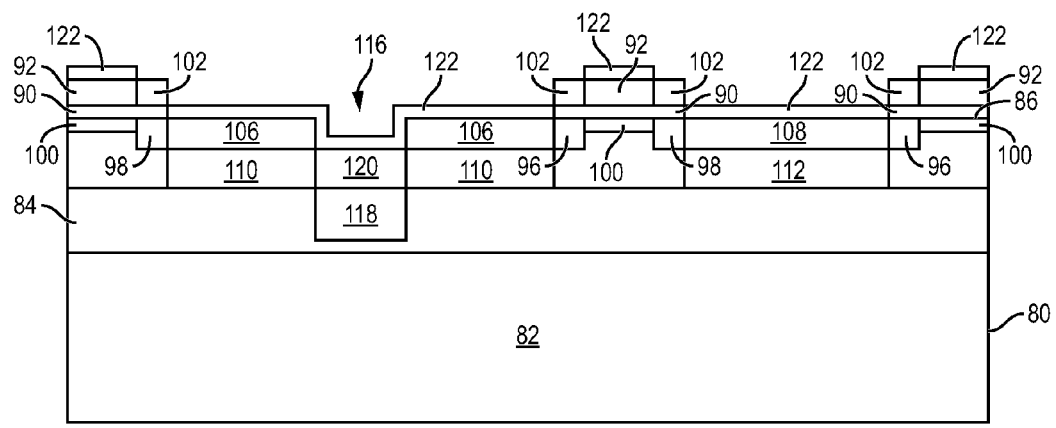
Figure 5Q:
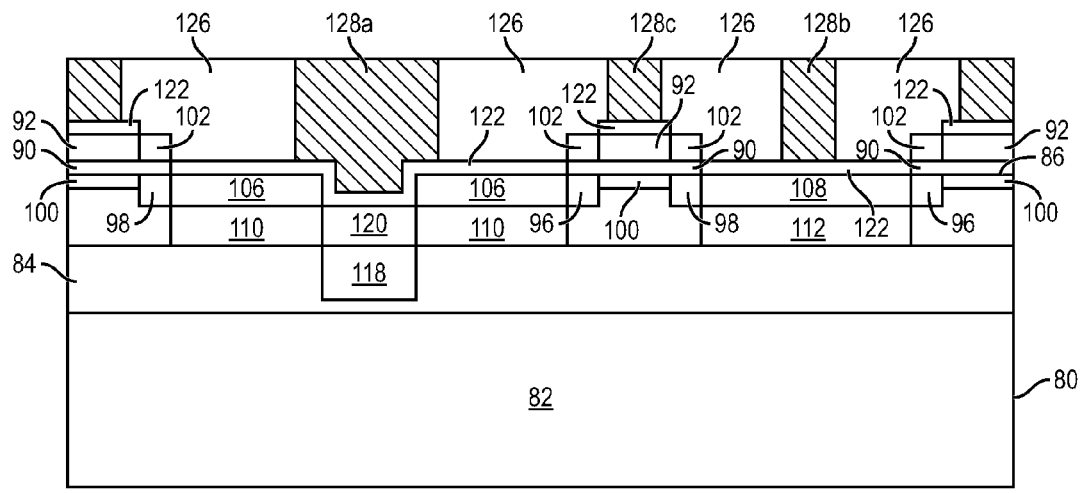
Figure 5R:
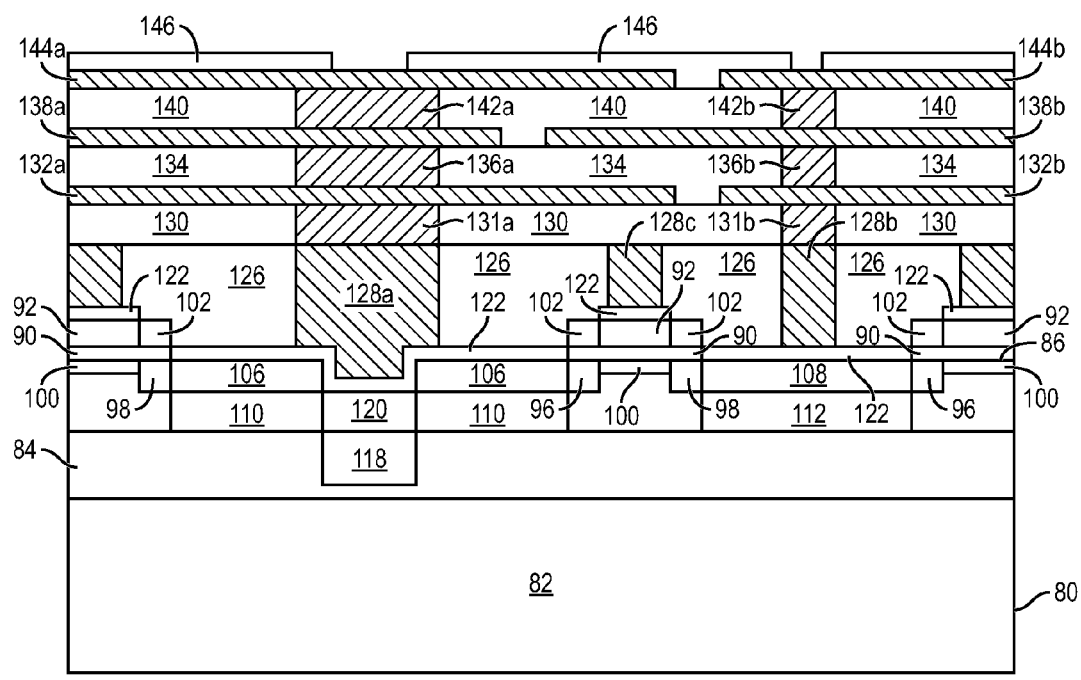

FIGS. 5a-5r illustrate a process of forming a low voltage (3.3 VDC) MOSFET cell 78 having applications in DC-DC power converters, OR-ing functions in data processing centers, and general purpose portable electronic devices. A plurality of MOSFET cells 78 is electrically connected in parallel to form a power MOSFET for high current carrying capacity. In one embodiment, the plurality of interconnected MOSFET cells 78 form power MOSFET 40 in FIG. 3. The low voltage characteristic of MOSFET cell 78 is particularly useful in power supply 64 requiring 3.3 volt rated power MOSFET in order to generate a 0.7 VDC operating potential for electronic equipment 66.

FIG. 5a shows a substrate 80 containing a base semiconductor material 82, such as silicon, germanium, gallium arsenide, indium phosphide, or silicon carbide, for structural support. For N-MOS devices, substrate 80 is initially doped with p-type semiconductor material, such as boron, aluminum, or gallium impurities, to form retrograde p-well region 84 to a depth of 300 nanometers (nm) below surface 86 of the substrate. The p-type dopant is deposited by ion implantation with dosage of 1E13 to 1E14 at hundreds of keV. Other implants can be deposited at appropriate dosages and energy levels. No mask is needed for the ion implantation. The retrograde p-well region 84 reduces punch through effect, serves to clamp the drain-to-source breakdown voltage ($BV_{DSS}$), decreases reverse recovery time, and generally improves robustness of MOSFET cell 78.

The MOSFET cell 78 can be an n-channel device (N-MOS) or a p-channel device (P-MOS), where "p" denotes a positive carrier type (hole) and "n" denotes a negative carrier type (electron). Although the present embodiment is described in terms of an N-MOS device, the opposite type semiconductor material can be used to form a P-MOS device. For example, an n-type substrate can be initially doped with n-type semiconductor material, such as phosphorus, antimony, or arsenic impurities, to form a retrograde n-well region.

Continuing with the formation of the N-MOS device, FIG. 5b shows a second implant of p-type semiconductor material into substrate 80 to form voltage threshold ($V_{TH}$) adjust region 88 on surface 86 of the substrate. The p-type dopant is deposited by ion implantation with dosage of 1E12 at tens of keV. No mask is needed for the ion implantation. The $V_{TH}$ adjust region 88 can be tuned by dopant levels to control $V_{TH}$ and reduce punch through effects.

In FIG. 5c, an insulating or dielectric layer 90 is formed over surface 86 of substrate 80 as a gate oxide layer. The insulating layer 90 contains one or more layers of silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable dielectric material. The insulating layer 90 is formed using PVD, CVD, screen printing, spin coating, spray coating, sintering, or thermal oxidation. In one embodiment, gate oxide layer 90 is 100 angstroms in thickness. The thickness of gate oxide layer 90 controls $V_{TH}$, hot carrier injection (HCI), $BV_{DSS}$, and gate-source voltage ($V_{GS}$) rating.

In FIG. 5d, a polysilicon layer 92 is formed over insulating layer 90 to a thickness of 100-200 nm. The resistance of polysilicon layer 92 can be reduced by heavy doping with n-type semiconductor material, such as arsenic. A photoresist layer 94 is formed over polysilicon layer 92. A portion of photoresist layer 94 is removed by an etching process corresponding to placement of the gate pattern, as shown in FIG. 5e. The portion of polysilicon layer 92 outside photoresist layer 94 is removed by an etching process, as shown in FIG. 5f.

In FIG. 5g, photoresist layer 94 is removed. Substrate 80 is doped with n-type semiconductor material, such as arsenic, to a depth of 20 nm below surface 86 of the substrate to form lightly doped drain (LDD) regions 96 and 98. The n-type dopant is deposited by ion implantation with dosage of 1E13 to 1E14 at 10-50 keV. Other implants can be deposited at appropriate dosages and energy levels. The LDD regions 96 and 98 can be tuned by dopant levels to reduce punch through effects and control HCI and $BV_{DSS}$. The area between LDD regions 96 and 98 is designed as n-channel 100.

In FIG. 5h, an insulating layer 102 is formed around polysilicon layer 92 over insulating layer 90. The insulating layer 102 contains one or more layers of SiO2, Si3N4, SiON, Ta2O5, Al2O3, polyimide, BCB, PBO, or other suitable dielectric material. The insulating layer 102 is formed using PVD, CVD, screen printing, spin coating, spray coating, sintering, or thermal oxidation. A portion of insulating layer 90 over LDD regions 96 and 98 is removed by an etching process using polysilicon layer 92 and insulating layer 102 as the mask. The remaining portion of insulating layer 90 extends about 150-200 nm beyond polysilicon layer 92 over LDD regions 96 and 98. The insulating layer 102 also operates as a sidewall spacer to mask subsequent drain and source ion implants.

In FIG. 5i, the portion of LDD regions 96 and 98 outside the mask are heavily doped with n-type semiconductor material, such as arsenic, to form N+ source region 106 and N+ drain region 108. The n-type dopant is deposited by ion implantation with dosage of 3E15 at 10-50 KeV using polysilicon layer 92 and insulating layer 102 as the mask. The N+ source region 106 and N+ drain region 108 have a low resistance ohmic contact for MOSFET cell 78.

In FIG. 5j, the portion of substrate 80 directly below N+ source region 106 and N+ drain region 108 and outside the mask is co-implanted with p-type semiconductor material, such as boron, to a depth of 350 nm below surface 86 of the substrate to form P+ clamping regions 110 and 112. The p-type dopant is deposited by ion implantation with dosage of 1E14 at 100 keV using polysilicon layer 92 and insulating layer 102 as the mask. The co-implant P+ claim regions 110 and 112 and N+ regions 106 and 108, respectively, operate as Zener diodes to reduce HCI, clamp $BV_{DSS}$ to 5-6 volts, and improve robustness of MOSFET cell 78.

FIG. 5k shows an alternate embodiment with photoresist layer 113 formed over polysilicon layer 92 and insulating layers 90 and 102, including the side walls of the insulating layers. The portion of substrate 80 directly below N+ source region 106 and N+ drain region 108 and outside the mask is implanted with p-type semiconductor material, such as boron, to a depth of 350 nm below surface 86 of the substrate to form P+ clamping regions 110 and 112. The p-type dopant is deposited by ion implantation with dosage of 1E14 at 100 keV using photoresist layer 113 as the mask. The implant P+ claim regions 110 and 112 and N+ regions 106 and 108, respectively, operate as Zener diodes to reduce HCI, clamp $BV_{DSS}$ to 5-6 volts, and improve robustness of MOSFET cell 78.

In FIG. 5l, photoresist layer 114 is formed over N+ source region 106, N+ drain region 108, polysilicon layer 92, and insulating layer 102. A portion of photoresist layer 114 over N+ source region 106 is removed by an etching process to expose a portion of the N+ source region. The exposed portion of N+ source region 106 is removed by the etching process to form a source trench 116. The source trench 116 is a continuous stripe along the width W of MOSFET cell 78. The source trench 116 has a width of 0.35 μm and depth of 0.15-0.20 (μm).

In FIG. 5m, a P+ plug 118 is formed through source trench 116 by implanting p-type semiconductor material, such as boron, to a depth of 0.3-0.4 μm. The p-type dopant is deposited by ion implantation with dosage of 1E14 at 50-100 keV using photoresist layer 114 as the mask. The P+ plug 118 improves robustness of MOSFET cell 78 by reducing parasitic base resistance.

In FIG. 5n, a P+ source tie 120 is formed through source trench 116 over P+ plug 118 by implanting p-type semiconductor material, such as BF2 or boron. The p-type dopant is deposited by ion implantation with dosage of 1E15 at 20 keV using photoresist layer 114 as the mask. The source trench 116 allows the cell pitch to be reduced while maintaining continuous low resistance contact to P+ source tie 120. The P+ source tie 120 improves robustness of MOSFET cell 78 by reducing parasitic base resistance.

In FIG. 5o, the photoresist layer 114 is removed, followed by rapid thermal anneal to activate dopants in MOSFET cell 78.

In FIG. 5p, a salicide layer 122 is formed over N+ source region 106 and N+ drain region 108 and polysilicon layer 92. Salicide layer 122 extends into source trench 116, following the contour of source trench 116, N+ source region 106, and P+ source tie 120. Salicide layer 122 is a low resistance layer to reduce parasitic interconnect resistance.

In FIG. 5q, an insulating layer or interlayer dielectric (ILD) 126 formed over salicide layer 122. The ILD 126 contains one or more layers of SiO2, Si3N4, SiON, Ta2O5, Al2O3, polyimide, BCB, PBO, or other suitable dielectric material. The ILD 126 is formed using PVD, CVD, screen printing, spin coating, spray coating, sintering, or thermal oxidation. A portion of ILD 126 is removed by an etching process to expose salicide layer 122 over P+ source tie 120 and a portion of N+ source region 106, polysilicon layer 92, and N+ drain region 108. Conductive layer 128 is formed over the exposed portions of salicide layer 122. In particular, conductive layer 128a is formed over N+ source region 106 and into source trench 116 to P+ source tie 120 as a source contact or terminal, conductive layer 128b is formed over N+ drain region 108 as a drain contact or terminal, and conductive layer 128c is formed over polysilicon layer 92 as a gate contact or terminal. Conductive layer 128 can be one or more layers of tungsten (W), aluminum (Al), copper (Cu), tin (Sn), nickel (Ni), gold (Au), silver (Ag), or other suitable electrically conductive material formed using patterning with PVD, CVD, sputtering, electrolytic plating, electroless plating process, or other suitable metal deposition process.

FIG. 5r shows additional interconnect layers formed over MOSFET cell 78. An insulating layer or passivation layer 130 is formed over ILD 126 and conductive layer 128 for electrical isolation. The insulating layer 130 contains one or more layers of SiO2, Si3N4, SiON, Ta2O5, Al2O3, or other suitable material having insulating and structural properties. The insulating layer 130 is formed using PVD, CVD, screen printing, spin coating, spray coating, sintering, or thermal oxidation. A portion of insulating layer 130 is removed by an etching process to expose conductive layer 128a and 128b. Conductive layer 131 is formed over conductive layer 128a and 128b. Conductive layer 132 is formed over conductive layer 131a and 131b and insulating layer 130. Conductive layers 131 and 132 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. Conductive layer 132a is electrically connected to conductive layer 131a, and conductive layer 132b is electrically connected to conductive layer 131b. Conductive layer 132a-132b can be electrically isolated or electrically common depending on the design and function of MOSFET cell 78. Conductive layer 128, 131, and 132 is a first level interconnect layer.

An insulating layer or passivation layer 134 is formed over conductive layer 132. The insulating layer 134 contains one or more layers of SiO2, Si3N4, SiON, Ta2O5, Al2O3, or other suitable material having insulating and structural properties. The insulating layer 134 is formed using PVD, CVD, screen printing, spin coating, spray coating, sintering, or thermal oxidation. A portion of insulating layer 134 is removed by an etching process to expose conductive layer 132a and 132b. Conductive layer 136 is formed over conductive layer 132a and 132b. Conductive layer 138 is formed over conductive layer 136a and 136b and insulating layer 134. Conductive layers 136 and 138 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. Conductive layer 136a and 138a is electrically connected to conductive layer 132a, and conductive layer 136b and 138b is electrically connected to conductive layer 132b. Conductive layer 138 can be electrically isolated or electrically common depending on the design and function of MOSFET cell 78. Conductive layer 136-138 is a second level interconnect layer.

An insulating layer or passivation layer 140 is formed over conductive layer 138. The insulating layer 140 contains one or more layers of SiO2, Si3N4, SiON, Ta2O5, Al2O3, or other suitable material having insulating and structural properties. The insulating layer 140 is formed using PVD, CVD, screen printing, spin coating, spray coating, sintering, or thermal oxidation. A portion of insulating layer 140 is removed by an etching process to expose conductive layer 138a and 138b. Conductive layer 142 is formed over conductive layer 138a and 138b. Conductive layer 144 is formed over conductive layer 142a and 142b and insulating layer 140. Conductive layers 142 and 144 can be one or more layers of W, Al, Cu, Sn, Ni, Au, Ag, or other suitable electrically conductive material formed using patterning with PVD, CVD, sputtering, electrolytic plating, electroless plating process, or other suitable metal deposition process. Conductive layer 142a and 144a is electrically connected to conductive layer 138a, and conductive layer 142b and 144b is electrically connected to conductive layer 138b. Conductive layer 144 can be electrically isolated or electrically common depending on the design and function of MOSFET cell 78. Conductive layer 142-144 is a third level interconnect layer.

An insulating layer or passivation layer 146 is formed over conductive layer 144. The insulating layer 146 contains one or more layers of SiO2, Si3N4, SiON, Ta2O5, Al2O3, or other suitable material having insulating and structural properties. The insulating layer 146 is formed using PVD, CVD, screen printing, spin coating, spray coating, sintering, or thermal oxidation. A portion of insulating layer 146 is removed by an etching process to expose conductive layer 144a and 144b for additional electrical interconnect. The first, second, and third level interconnect layers provide common connections to each N+ source region 106, common connections to each N+ drain region 108, and common connections to each gate structure 92 for a plurality of MOSFET cells 78. The first, second, and third level interconnect layers also provide connections to external terminals of the semiconductor package containing MOSFET cell 78. Other electric devices can be formed over substrate 80 to realize analog or digital circuit functions.

Figure 6:
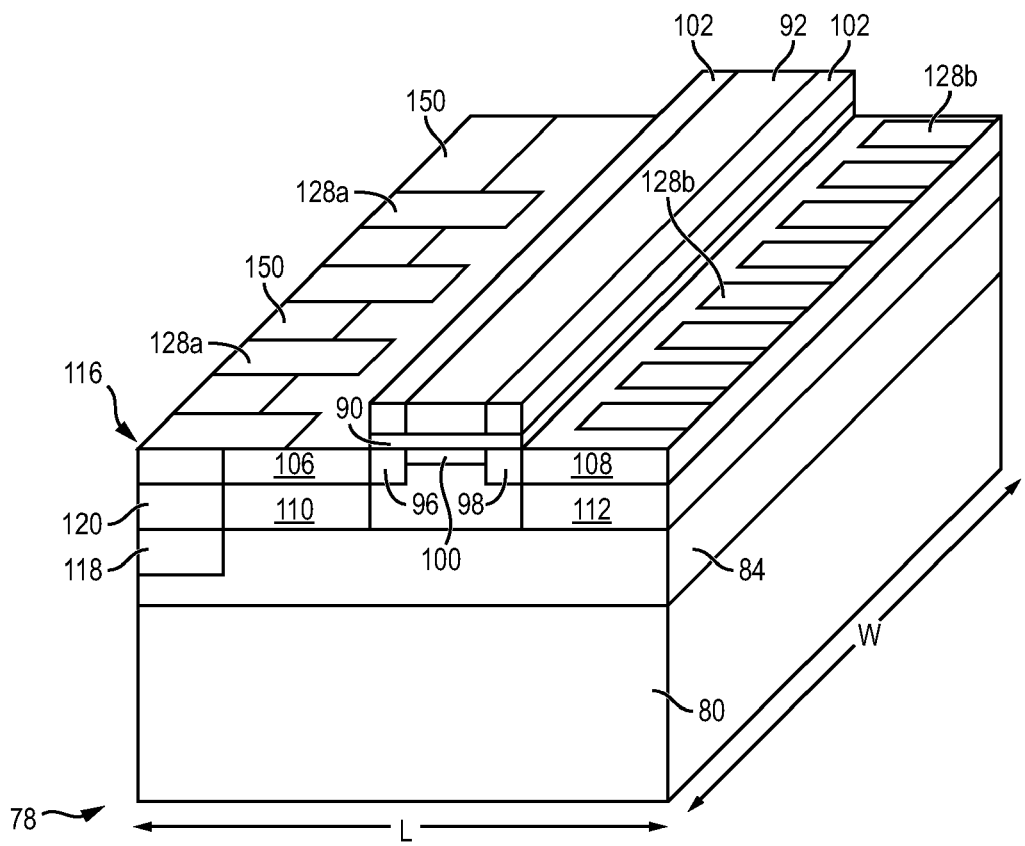
FIG. 6 illustrates the low voltage MOSFET cell with the source trench, P+ plug, and co-implanted clamp diodes.

FIG. 6 illustrates a prospective view of MOSFET cell 78 having length L and width W. The retrograde p-well region 84 is formed within substrate 80. N+ source region 106 and N+ drain region 108 are formed over co-implant P+ clamping regions 110 and 112. Gate structure 90-92 is formed over n-channel 100 separating N+ source region 106 and LDD region 96 from N+ drain region 108 and LDD region 98. The insulating sidewall spacers 102 are formed around gate structure 90-92. The source trench 116 formed through N+ source region 106 allows formation of P+ plug 118 and P+ source tie 120. Conductive layer 128a is formed over N+ source region 106 and into the source trench to electrically connect to N+ source region 106, P+ source tie 120, and P+ plug 118. As seen in FIG. 6, an insulating layer 150 is also formed in the source trench between conductive layer 128a. Conductive layer 128b is formed over N+ drain region 108 to electrically connect to the N+ drain region.

Figure 7:
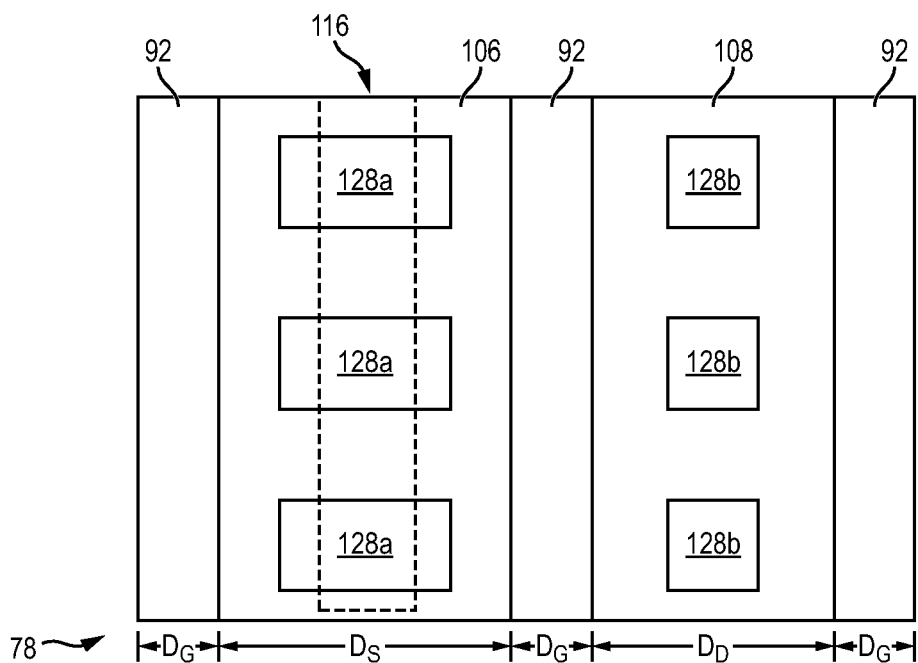
FIG. 7 illustrates a top view of the low voltage MOSFET cell with a straight source trench.

FIG. 7 shows a top view of MOSFET cell 78 with source trench 116 in a straight configuration. In one embodiment, the width $D_G$ of polysilicon layer 92 is 0.20 μm. The width $D_S$ of N+ source region 106 is 1.14-1.19 μm. The width $D_D$ of N+ drain region 108 is 0.74-0.79 μm. In other embodiments, the width $D_S$ of N+ source region 106 can be as small as 0.50 μm. Source trench 116 reduces the N+ source region width $D_S$ and accordingly the MOSFET cell pitch to about 2.28 μm. The smaller cell pitch reduces $R_{DSON}$ to the range of hundreds of microohms for MOSFET cell 78. Source trench 116 can also be arranged in a serpentine, sawtooth, or discrete offset sectional configuration.

Figure 8:
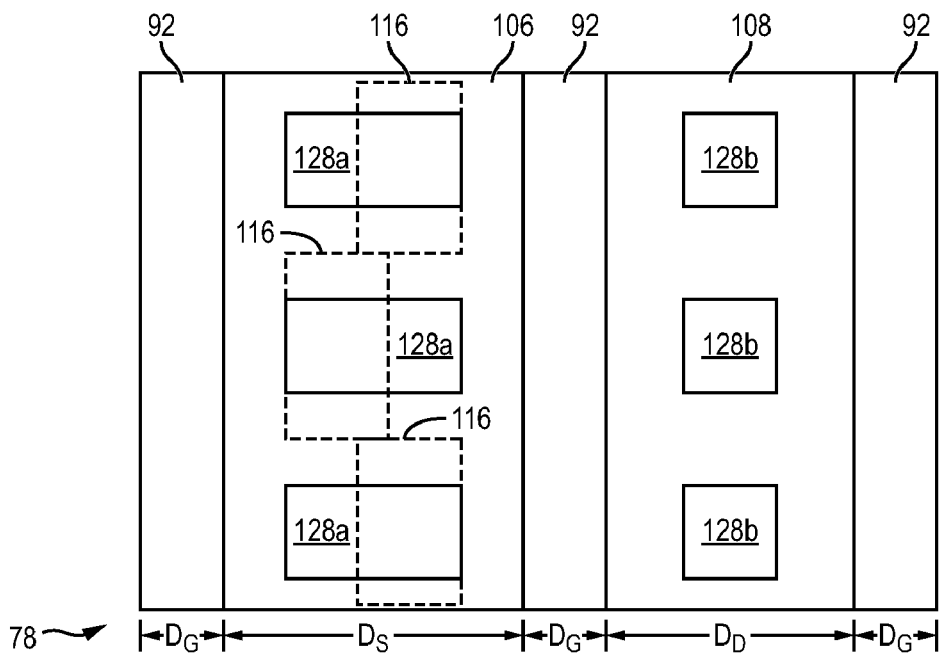
FIG. 8 illustrates a top view of the low voltage MOSFET cell with a discrete offset sectional source trench.

FIG. 8 shows a top view of MOSFET cell 78 with source trench 116 in the discrete offset sectional configuration. In one embodiment, the width $D_G$ of polysilicon layer 92 is 0.20 μm. The width $D_S$ of N+ source region 106 is 0.94 μm. The width $D_D$ of N+ drain region 108 is 0.74 μm. The offset source trench 116 further reduces the N+ source region width $D_S$ and accordingly the MOSFET cell pitch to about 2.08 μm. The smaller cell pitch reduces $R_{DSON}$ to the range of hundreds of microohms for MOSFET cell 78.

Figure 9:
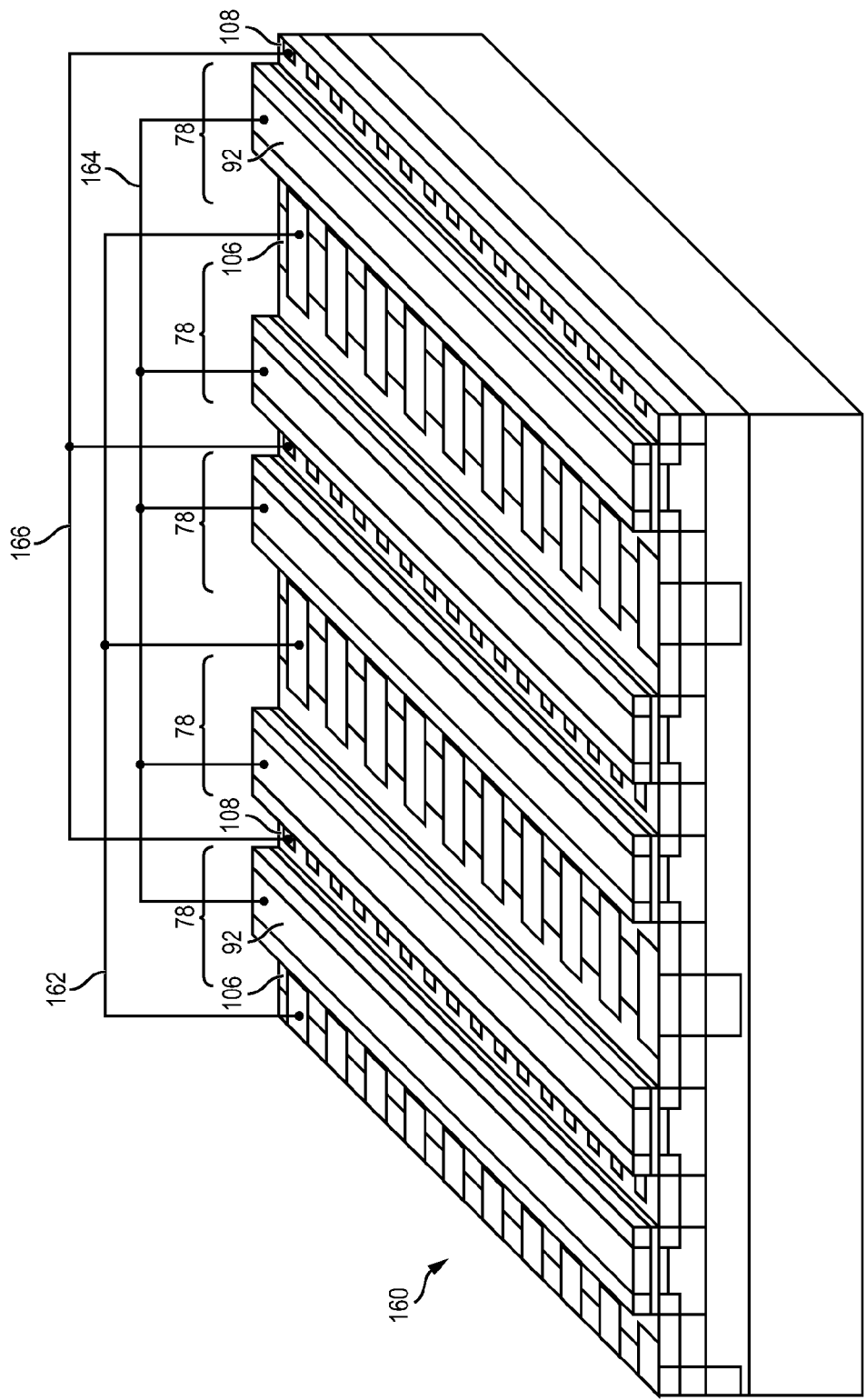
FIG. 9 illustrates a plurality of low voltage MOSFET cells electrically connected in parallel to form a power MOSFET.

FIG. 9 shows a striped array of MOSFET cells 78, potentially hundreds or thousands of cells, electrically connected in parallel to form power MOSFET 160. N+ source regions 106 are commonly connected with conductive trace 162, polysilicon layers 92 are commonly connected with conductive trace 164, and N+ drain regions 108 are commonly connected with conductive trace 166. Power MOSFET 160 operates as a single monolithic switching device capable of handling many amperes of electrical current. The routing of conductive interconnects 162-166 minimizes parasitic resistance and inductance across power MOSFET 160.

Figure 10A:
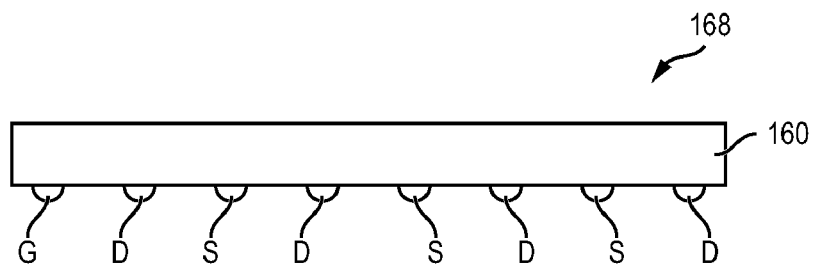
FIGS. 10a-10b illustrate the external electrical interconnect for the power MOSFET in a BGA package.
Figure 10B:
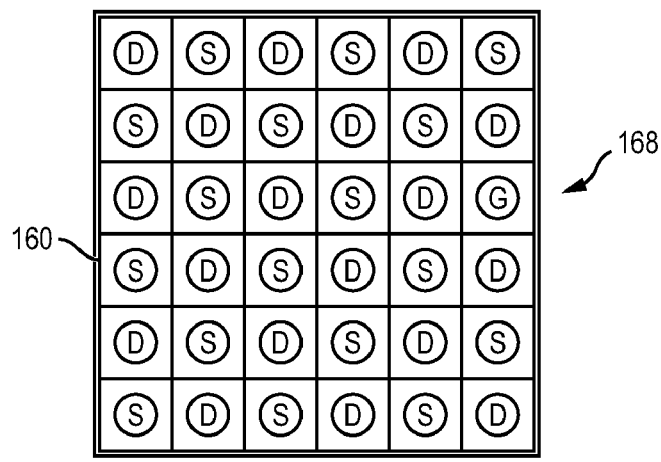

FIGS. 10a and 10b show power MOSFET 160 contained within ball grid array (BGA) package 168 having dimensions of 3.175 mm×3.175 mm. Power MOSFET 160 containing a striped array of interconnected MOSFET cells 78 covers most of the die or package area. The external contacts S are electrically connected to conductive trace 162 for N+ source region 106, contacts G are electrically connected to conductive trace 164 for polysilicon gate region 92, and contacts D are electrically connected to conductive trace 166 for N+ drain region 108. In one embodiment, contacts S, contact D, and contacts G are interconnect bumps. Power MOSFET 160 can also be configured in a flipchip type semiconductor device to minimize parasitic resistance, inductance, and capacitance and to make the device suitable for high frequency switching applications in the MHz range. For example, low voltage DC-DC converters can be made very small and have high performance by enabling high switching frequency.

Power MOSFET 160 is designed for low voltage applications, i.e., those implementing a maximum rating of 3.3 VDC, as described in FIG. 4. One goal of the low voltage MOSFET is to provide low $R_{DSON}$ and low $BV_{DSS}$. In power MOSFETs, the possibility of avalanche breakdown causes reliability and performance issues. For low voltage applications, e.g., 3.3 VDC, the externally applied drain-to-source voltage may exceed the $BV_{DSS}$ of MOSFET cell 78, potentially placing the device into avalanche. Normally, surface avalanche occurs in the region between the drain region and gate oxide. Hot carriers are injected into the gate oxide which leads to long-term degradation of device parametrics. In addition, high voltage and high current simultaneously exist causing excessive heat generation. The inherent parasitic N-P-N bipolar transistor within the MOSFET can be activated, in a condition known as snapback, wherein that minority carriers generated by avalanche between the gate oxide and drain region have to travel only a short distance to reach the N+ source (emitter of the parasitic NPN). The effective NPN base length ($L_B$) becomes quite small, leading to possible snapback condition and long term degradation of the device. In MOSFET cell 78, if avalanche breakdown does occur, P+ clamping regions 110 and 112 limit the effect to an area well below surface 86, i.e., to the p-n junction formed by the P+ clamping region and N+ source region 106 and N+ drain region 108. By forcing the avalanche carriers to be generated further from the emitter, the effective $L_B$ is increased, and the device can safely handle higher levels of avalanche current. The base doping concentration in the clamp diode is made as high as possible, which creates a higher rate of minority carrier recombination in the base. In one embodiment, the clamp diode implant can be accomplished as a co-implant with the self-aligned N+ source/drain implant, as shown in FIG. 5j, or by utilizing the retrograde p-well implant, or combination of both. The layout features of MOSFET cells 78, namely smaller width N+ source region 106 due to source trench 116, provide for reduced cell pitch and lower $R_{DSON}$ and $BV_{DSS}$.

In addition, the parasitic base resistance ($R_B$) between the substrate (or p well) and P+ source region 106 should be made as small as possible across the entire width W of MOSFET cell 78. The base resistance $R_B$ is reduced by placing P+ source ties 120 along the entire width W of MOSFET cell 78, either in a continuous stripe, or in closely spaced discrete arrangements, within or beneath source trench 116. A supplemental P+ plug implant 118 is placed underneath P+ source tie 120 to increase the minority carrier recombination in the base and further to reduce snapback and improve avalanche ruggedness.

Figure 11:
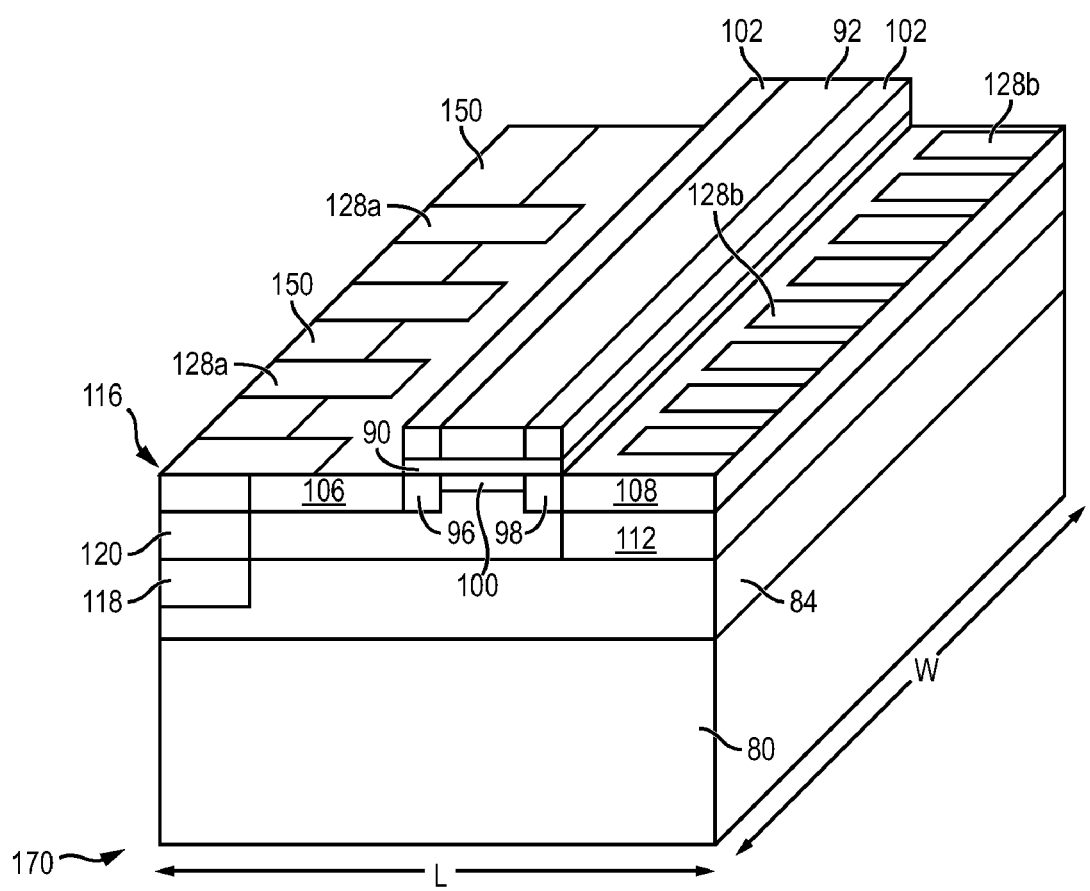
FIG. 11 illustrates the low voltage MOSFET cell with the source trench, P+ plug, P+ source tie, and clamp diode.

FIG. 11 illustrates another embodiment of MOSFET cell 170, similar to FIG. 6, with single implant P+ clamping region 112 beneath N+ drain region 108. The retrograde p-well region 84 is formed within substrate 80. N+ drain region 108 is formed over single implant P+ clamping region 112. Gate structure 90-92 is formed over n-channel 100 separating N+ source region 106 and LDD regions 96 from N+ drain region 108 and LDD region 98. The insulating sidewall spacers 102 are formed around gate structure 90-92. The source trench 116 formed through N+ source region 106 allows formation of P+ plug 118 and P+ source ties 120. Conductive layer 128a is formed over N+ source region 106 and into the source trench to electrically connect to N+ source region 106, P+ source ties 120, and P+ plug 118. The insulating layer 150 is formed in the source trench between conductive layer 128a. Conductive layer 128b is formed over N+ drain region 108 to electrically connect to the N+ drain region.

Figure 12:
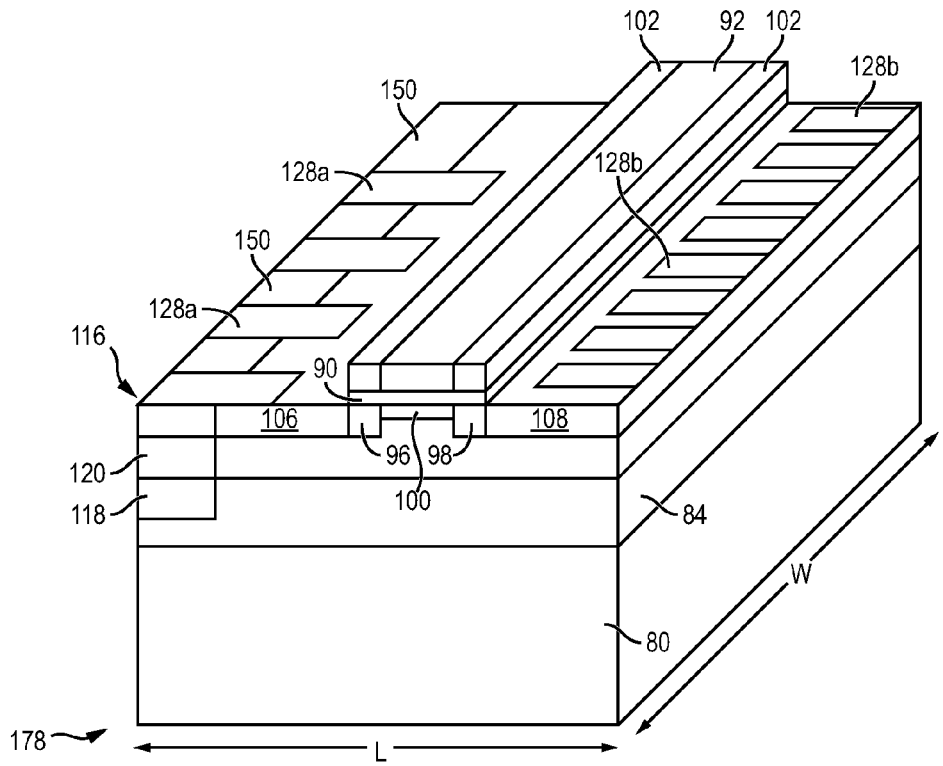
FIG. 12 illustrates the low voltage MOSFET cell with the source trench, P+ plug, and P+ source tie.

FIG. 12 illustrates another embodiment of MOSFET cell 178, similar to FIG. 6, with a continuous P+ source trench 116, i.e., without P+ clamping regions 110 and 112. The retrograde p-well region 84 is formed within substrate 80. Gate structure 90-92 is formed over n-channel 100 separating N+ source region 106 and LDD regions 96 from N+ drain region 108 and LDD region 98. The insulating sidewall spacers 102 are formed around gate structure 90-92. The source trench 116 formed through N+ source region 106 allows formation of P+ plug 118 and P+ source ties 120. Conductive layer 128a is formed over N+ source region 106 and into the source trench to electrically connect to N+ source region 106, P+ source ties 120, and P+ plug 118. The insulating layer 150 is formed in the source trench between conductive layer 128a. Conductive layer 128b is formed over N+ drain region 108 to electrically connect to the N+ drain region.

Figure 13:
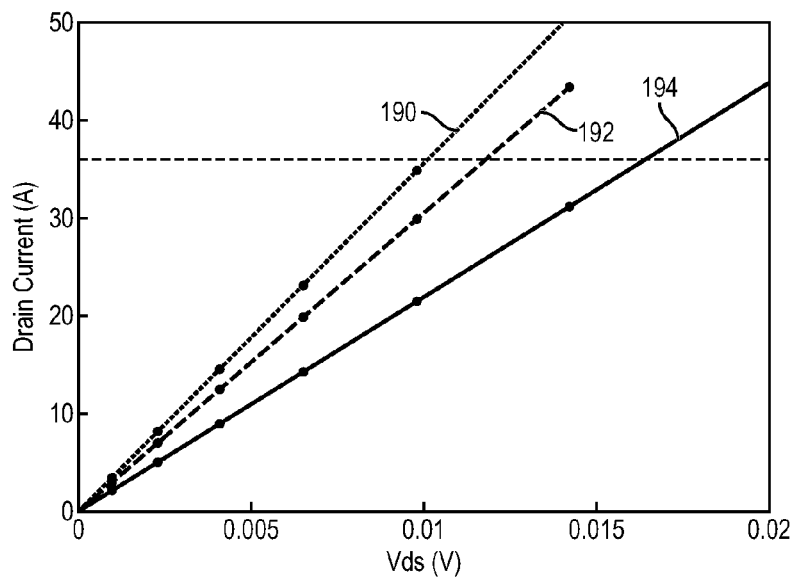
FIG. 13 is a graph of $R_{DSON}$ values for different embodiments of the low voltage MOSFET cell.

FIG. 13 is a graph of drain current and drain-to-source voltage for different configurations of the MOSFET. Curve 190 represents an embodiment of a 3.3 VDC MOSFET cell according to FIG. 7. Curve 192 represents the prior art structure according to FIG. 1 with 3.3 VDC MOSFET cell. Curve 194 represents the prior art structure according to FIG. 1 with 5.0 VDC MOSFET cell. The linear region of curves 190, 192, and 194 indicates typical values of $R_{DSON}$.

Figure 14:
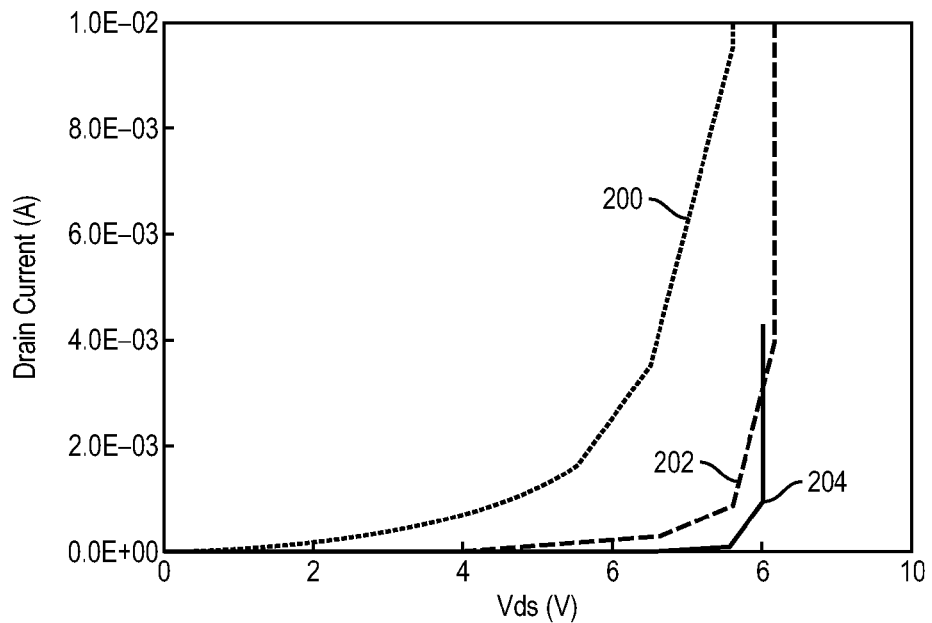
FIG. 14 is a graph of $BV_{DSS}$ values for different embodiments of the low voltage MOSFET cell.

FIG. 14 is a graph of drain current and drain-to-source voltage for different configurations of the MOSFET. Curve 200 represents an embodiment of a 3.3 VDC MOSFET cell according to FIG. 7. Curve 202 represents the prior art structure according to FIG. 1 with 3.3 VDC MOSFET cell. Curve 204 represents the prior art structure according to FIG. 1 with 5.0 VDC MOSFET cell. The non-linear region of curves 200, 202, and 204 indicates typical values of $BV_{DSS}$.

Figure 15:
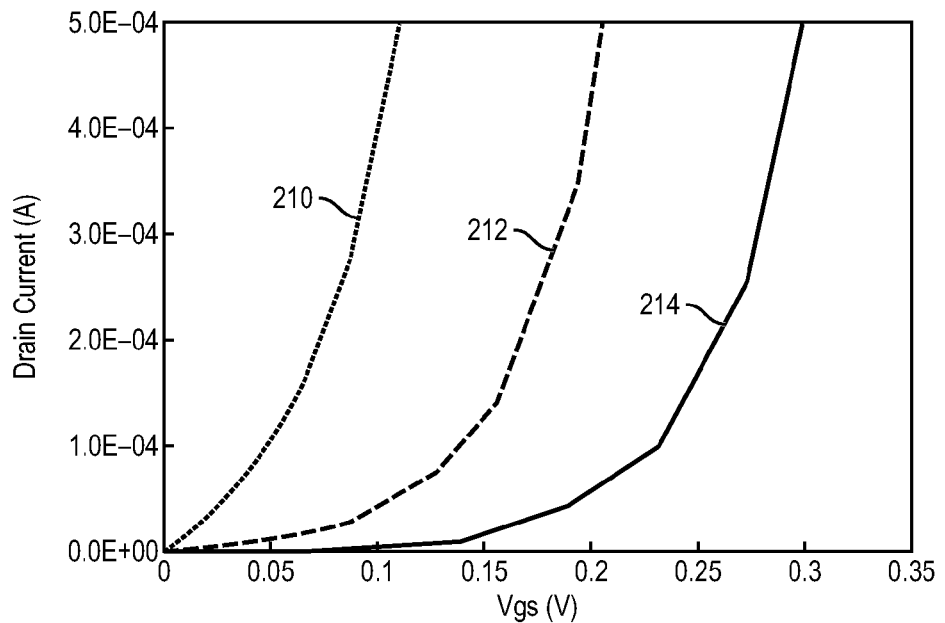
FIG. 15 is a graph of $V_{TH}$ values for different embodiments of the low voltage MOSFET cell.

FIG. 15 is a graph of drain current and gate-to-source voltage for different configurations of the MOSFET. Curve 210 represents an embodiment of a 3.3 VDC MOSFET cell according to FIG. 7. Curve 212 represents the prior art structure according to FIG. 1 with 3.3 VDC MOSFET cell. Curve 214 represents the prior art structure according to FIG. 1 with 5.0 VDC MOSFET cell. The non-linear region of curves 210, 212, and 214 indicates typical values of $V_{TH}$.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   forming a well region within the substrate;
   forming a gate structure over a surface of the substrate;
   forming a source region within the substrate adjacent to the gate structure;
   forming a drain region within the substrate adjacent to the gate structure opposite the source region;
   forming a first clamping region and second clamping region below the source region and drain region, respectively;
   forming a trench through the source region;
   forming a plug through the trench into the well region;
   forming a source tie through the trench over the plug; and
   forming an interconnect structure over the source region, drain region, and gate structure.

2. The method of claim 1, further including forming a voltage threshold adjust region on the surface of the substrate.

3. The method of claim 1, further including forming a salicide layer over the source region, source tie, gate structure, and drain region prior to forming the interconnect structure.

4. The method of claim 1, further including forming an insulating layer adjacent to the gate structure.

5. The method of claim 1, further including forming the trench in a straight, serpentine, sawtooth, or discrete offset sectional configuration.

6. The method of claim 1, wherein the source region has a width less than 1.19 micrometers.

7. A method of making a semiconductor device, comprising:
   providing a substrate;
   forming a well region within the substrate;
   forming a gate structure over a surface of the substrate;
   forming a source region within the substrate adjacent to the gate structure;
   forming a drain region within the substrate adjacent to the gate structure opposite the source region;
   forming a first clamping region and second clamping region below the source region and drain region, respectively;
   forming a trench through the source region;
   forming a plug through the trench;
   forming a source tie through the trench over the plug; and
   forming an interconnect structure over the source region, drain region, and gate structure.

8. The method of claim 7, further including forming a voltage threshold adjust region on the surface of the substrate.

9. The method of claim 7, further including forming a salicide layer over the source region, source tie, gate structure, and drain region prior to forming the interconnect structure.

10. The method of claim 7, further including forming an insulating layer adjacent to the gate structure.

11. The method of claim 7, further including forming the trench in a straight, serpentine, sawtooth, or discrete offset sectional configuration.

12. The method of claim 7, wherein the source region has a width less than 1.19 micrometers.

13. A semiconductor device, comprising:
   a substrate;
   a well region formed within the substrate;
   a gate structure formed over a surface of the substrate;
   a source region formed within the substrate adjacent to the gate structure;

a drain region formed within the substrate adjacent to the gate structure opposite the source region;
a first clamping region and second clamping region formed below the source region and drain region, respectively;
a trench formed through the source region;
a plug formed through the trench;
a source tie formed through the trench over the plug; and
an interconnect structure formed over the source region, drain region, and gate structure.

14. The semiconductor device of claim 13, further including an insulating layer formed adjacent to the gate structure.

15. The semiconductor device of claim 13, further including forming the trench in a straight, serpentine, sawtooth, or discrete offset sectional configuration.

16. The semiconductor device of claim 13, wherein the source region has a width less than 1.19 micrometers.

17. The semiconductor device of claim 13, further including a power supply integrating the semiconductor device and adapted for providing an output voltage to electronic equipment.

18. The semiconductor device of claim 13, wherein the electronic equipment includes a portable electronic device or data processing center.

19. A power supply providing an output voltage to electronic equipment, comprising:
a an inductor coupled for receiving an input voltage of the power supply;
a control circuit having an input coupled for receiving an output voltage of the power supply; and
a power transistor having a drain terminal coupled to the inductor, gate terminal coupled to an output of the control circuit, and source terminal coupled to a power supply conductor, the power transistor including,
(a) a substrate,
(b) a well region formed within the substrate,
(c) a gate structure formed over a surface of the substrate and coupled to the gate terminal,
(d) a source region formed within the substrate adjacent to the gate structure and coupled to the source terminal,
(e) a drain region formed within the substrate adjacent to the gate structure opposite the source region and coupled to the drain terminal,
(f) a first clamping region and second clamping region formed below the source region and drain region, respectively,
(g) a trench formed through the source region,
(h) a plug formed through the trench, and
(i) a source tie formed through the trench over the plug.

20. The power supply of claim 18, further including forming the trench in a straight, serpentine, sawtooth, or discrete offset sectional configuration.

21. The power supply of claim 18, wherein the source region has a width less than 1.19 micrometers.

22. The power supply of claim 18, wherein the electronic equipment includes a portable electronic device or data processing center.

* * * * *